(12) United States Patent
Carome et al.

(10) Patent No.: US 11,112,087 B2
(45) Date of Patent: Sep. 7, 2021

(54) INFRARED SOURCE FOR AIRPORT RUNWAY LIGHT APPLICATIONS

(71) Applicant: Surface Igniter, LLC, Chagrin Falls, OH (US)

(72) Inventors: Edward Carome, Beachwood, OH (US); George C. Hanna, Chagrin Falls, OH (US)

(73) Assignee: Surface Igniter, LLC, Chagrin Falls, OH (US)

( * ) Notice: Subject to any disclaimer, the term of this patent is extended or adjusted under 35 U.S.C. 154(b) by 0 days.

(21) Appl. No.: 16/852,424

(22) Filed: Apr. 18, 2020

(65) Prior Publication Data

US 2020/0332983 A1    Oct. 22, 2020

Related U.S. Application Data

(60) Provisional application No. 62/835,822, filed on Apr. 18, 2019.

(51) Int. Cl.
| | |
|---|---|
| *F21V 9/04* | (2018.01) |
| *F21V 7/06* | (2006.01) |
| *F21V 23/04* | (2006.01) |
| *B64F 1/20* | (2006.01) |
| *H01K 1/04* | (2006.01) |

(Continued)

(52) U.S. Cl.
CPC ............... *F21V 9/04* (2013.01); *B64F 1/20* (2013.01); *F21V 7/06* (2013.01); *F21V 23/0464* (2013.01); *H01K 1/04* (2013.01); *H01K 1/14* (2013.01); *H01K 1/26* (2013.01); *B64D 2203/00* (2013.01); *F21W 2111/06* (2013.01); *F21Y 2115/10* (2016.08); *H01K 1/20* (2013.01)

(58) Field of Classification Search
None
See application file for complete search history.

(56) References Cited

U.S. PATENT DOCUMENTS

| | | |
|---|---|---|
| 5,485,151 A | 1/1996 | Runyon et al. |
| 6,600,274 B1 | 7/2003 | Hughes |

(Continued)

FOREIGN PATENT DOCUMENTS

| | | |
|---|---|---|
| KR | 20170012527 A | 2/2017 |
| WO | 2014024347 A1 | 2/2014 |
| WO | 2017004208 A1 | 1/2017 |

OTHER PUBLICATIONS

International Search Report for corresponding PCT/US20/28874 dated Aug. 4, 2020, 2 pgs.

(Continued)

*Primary Examiner* — Vip Patel
(74) *Attorney, Agent, or Firm* — Rankin, Hill & Clark LLP

(57) ABSTRACT

An airport runway light for use as a runway approach light for a runway lighting system, the runway light having a light body with a base configured to support the runway light in a light socket of a runway lighting system, the base having an electrical connection to electrically connect the runway light to the runway lighting system, the light further including one or more output windows wherein the runway light has a high-efficiency infrared source and one or more infrared reflectors to direct the infrared source outwardly through the one or more output windows, the infrared source including a silicon nitride element wherein the infrared source produces virtually no detectable visible light and with much less power consumption.

19 Claims, 5 Drawing Sheets

(51) Int. Cl.
  *H01K 1/14* (2006.01)
  *H01K 1/26* (2006.01)
  *F21Y 115/10* (2016.01)
  *F21W 111/06* (2006.01)
  *H01K 1/20* (2006.01)

(56) References Cited

U.S. PATENT DOCUMENTS

| | | |
|---|---|---|
| 6,663,801 B2 | 12/2003 | Pegram et al. |
| 7,006,763 B2 | 2/2006 | Miller et al. |
| 7,023,361 B1 | 4/2006 | Wallace et al. |
| 7,083,315 B2 | 8/2006 | Hansler et al. |
| 7,175,314 B2 | 2/2007 | Laenen et al. |
| 7,300,186 B2 | 11/2007 | Cuypers et al. |
| 7,357,530 B2 | 4/2008 | Wang et al. |
| 7,629,601 B2 | 12/2009 | Glassner et al. |
| 8,128,254 B2 | 3/2012 | Laenen et al. |
| 8,293,451 B2 | 10/2012 | Glodde et al. |
| 8,508,128 B2 | 8/2013 | Tidhar |
| 8,651,686 B2 | 2/2014 | Beukema et al. |
| 9,206,961 B1 | 12/2015 | Bastiani et al. |
| 9,657,906 B1 | 5/2017 | Cassandra et al. |
| 9,853,413 B2 | 12/2017 | Kim |
| 2006/0083017 A1 | 4/2006 | Wang |
| 2009/0091268 A1 | 4/2009 | Forssen et al. |
| 2010/0033966 A1 | 2/2010 | Laenen et al. |
| 2010/0080542 A1 | 4/2010 | Tartock |
| 2013/0094192 A1 | 4/2013 | De Boeck et al. |
| 2014/0209803 A1 | 7/2014 | Hamberger et al. |

OTHER PUBLICATIONS

Espacenet Bibliographic data:KR 20170012527 (A), Published Feb. 2, 2017, 1 pg.
Espacenet Bibliographic data:WO 2014024347 (A1), Published Feb. 13, 2014, 1 pg.
Espacenet Bibliographic data:WO 2017004208 (A1), Published Jan. 5, 2017, 1 pg.

INFRARED SOURCE FOR AIRPORT RUNWAY LIGHT APPLICATIONS

This application claims priority in Provisional Application Ser. No. 62/835,822 that was filed on Apr. 18, 2019, which is incorporated by reference herein.

The invention of this application relates to airport runway lighting. More particularly, the invention relates to a new infrared (IR) source used for runway lights and the like.

The present disclosure relates to approach lighting used in an airport runway, and more specifically, to an energy saving semiconductor light source used for a runway approach light.

INCORPORATION BY REFERENCE

The invention of this application relates to an IR source for runway lighting. U.S. Pat. No. 9,853,413 to Kim discloses an Airport Runway Approach Lighting Apparatus and is incorporated by reference for showing the same and forms part of the specification of this application. U.S. Pat. No. 7,023,361 to Wallace et al. discloses a Covert Runway Lighting Apparatus and Method and is incorporated by reference for showing the same and forms part of the specification of this application. Patent Publication No. US 2010/0080542 to Tartock discloses an Infrared LED Apparatus And Surface Heater and is incorporated by reference for showing the same and forms part of the specification of this application. Patent Publication No. US 2006/0083017 to Wang et al. discloses a Solid-State Lighting Apparatus for Navigational Aids and is incorporated by reference for showing the same and forms part of the specification of this application. U.S. Pat. No. 7,357,530 to Wang et al. discloses a Lighting Apparatus For Navigational Aids and is incorporated by reference for showing the same and forms part of the specification of this application. U.S. Pat. No. 8,508,128 to Tidhar discloses a System For Providing Thermal Energy Radiation Detectable By A Thermal Imaging Unit and is incorporated by reference for showing the same and forms part of the specification of this application. U.S. Pat. No. 8,651,686 to Beukema et al. discloses a Lighting Unit for Lighting Airfields and is incorporated by reference for showing the same and forms part of the specification of this application. U.S. Pat. No. 7,629,601 to Glassner et al. discloses a LED Flasher and is incorporated by reference for showing the same and forms part of the specification of this application. U.S. Pat. No. 7,300,186 to Cuypers et al. discloses a Blister Lights Used for Signaling and/or Marking Purposes and is incorporated by reference for showing the same and forms part of the specification of this application. U.S. Pat. No. 7,175,314 to Laenen et al. discloses a Unidirectional Lighting Device For Illuminating Objects and/or For Marking Lanes, Preferably In The Airport Area and is incorporated by reference for showing the same and forms part of the specification of this application. U.S. Pat. No. 8,128,254 to Laenen et al. discloses a Flush-Mounted Flashing Light and is incorporated by reference for showing the same and forms part of the specification of this application. Patent Publication No. US 2009/0091268 to Forssen et al. discloses an Airfield Lighting with LED and is incorporated by reference for showing the same and forms part of the specification of this application. U.S. Pat. No. 5,485,151 to Runyon et al. discloses an Airfield Lighting System and is incorporated by reference for showing the same and forms part of the specification of this application. U.S. Pat. No. 7,083,315 to Hansler et al. discloses an Elevated Airfield Runway and Taxiway Edge-Lights Utilizing Light Emitting Diodes and is incorporated by reference for showing the same and forms part of the specification of this application. Patent Publication No. US 2010/0033966 to Laenen et al. discloses a Glide-Angle Light for Approach Guidance of Aircraft and is incorporated by reference for showing the same and forms part of the specification of this application. Patent Publication No. US 2013/0094192 to De Boeck et al. discloses an Elevated Airfield LED Lighting Device and is incorporated by reference for showing the same and forms part of the specification of this application. U.S. Pat. No. 6,600,274 to Hughes discloses a LED Current Regulation Circuit For Aircraft Lighting System and is incorporated by reference for showing the same and forms part of the specification of this application. U.S. Pat. No. 9,206,961 to Bastiani et al. discloses a LED Elevated Light Fixture and Method and is incorporated by reference for showing the same and forms part of the specification of this application. U.S. Pat. No. 9,657,906 to Cassandra et al. discloses a Light-Emitting Diode Runway End Identifier Light System and is incorporated by reference for showing the same and forms part of the specification of this application. Also incorporated by reference into this application is the attached article titled "Lighting Systems—Medium Approach Light System with Runway Alignment Indicator Lights (MALSR) from the Federal Aviation Administration.

BACKGROUND OF THE INVENTION

Airport runway approach lights are used to assist aircrafts in landing on a runway. Prior art runway approach lights include a thermal source such as an incandescent bulb and a halogen lamp. The thermal source emits infrared spectral components in addition to components of a visible light spectrum. When weather conditions are favorable and visibility is good, a pilot during landing uses the components of the visible spectrum with naked eyes while viewing the runway approach lights. However, when the weather conditions are unfavorable or the visibility is bad, a pilot uses an infrared (IR) camera or an enhanced flight vision system (EFVS) equipped in the cockpit to detect infrared rays emitted from the thermal source for safe landing.

The power consumption of a thermal source used for runway approach light is very large (around 100 Watts to 500 Watts). Therefore, the thermal source is extremely inefficient because the quantum efficiency to convert energy from an input electrical power to an optical power is very low, and the beam shaping mechanism to convert a generated beam pattern to a required beam pattern is difficult resulting in a high coupling loss.

As a result, a need for an approach light with an energy efficient light emitting diode (LED) light source has been raised recently. However, an energy-efficient LED (e.g., a steady burning white light LED and a threshold green light LED) has, in a practical situation, only a visible spectrum and its almost no infrared wavelengths. As such, an LED light source is not appropriate as a runway approach light for a next generation airport system because it cannot be safely used during severe or low visibility weather conditions.

To solve this issue, attempts have been made to find an efficient infrared (IR) light source to be used in an airport runway approach light. However, there is still a need for an efficient IR source of sufficient intensity for runway lights.

SUMMARY OF THE INVENTION

The invention of this application relates to airport runway lighting. More particularly, the invention relates to a new infrared (IR) source used for runway lights and the like. In this respect, the present invention relates to an approach light used in an airport runway, and more specifically, to an approach light that includes an energy saving semiconductor IR light source used for a runway approach light.

According to one aspect of the present invention, provided is an approach light that includes an IR source for runway lighting that utilizes a new IR Source.

In greater detail, the present invention relates to an approach light that includes an IR Source that includes a silicon nitride IR source. It has been found that a silicon nitride IR Source produces both the infrared intensity needed for runway applications and produces the needed infrared focal point for use with a parabolic reflector to direct the infrared outwardly in a beam shape that is needed in runway applications. While materials like silicon carbide have been used to produce infrared radiation in the past, Applicant has found that silicon carbide IR sources do not work effectively for runway applications. In this respect, silicon carbide IR sources have been used in laboratories for many years. However, while silicon carbide IR sources work well in laboratory environments, Applicant has found that they do not work well for runway applications. Silicon carbide sources do not produce the needed infrared intensity to transmit infrared the distances needed for runway applications. In addition, silicon carbide IR sources do not have the needed beam concentration for use with parabolic reflectors wherein much of the infrared output is not utilized since the infrared produced is spaced from the focal point of the parabolic reflector. Moreover, increasing the size of the silicon carbide IR source to produce the needed infrared output, causes even more of the infrared radiation to be produced away from the focal point of the parabolic reflector. Yet further, the electrical properties, and therefore their optical ones also, for silicon carbide IR sources do not remain constant over time when they are operated for long periods. The properties of silicon carbide sources tend to drift substantially, which also prevent effective use in runway applications and produce more efficiency loses. Accordingly, there are efficiency losses when silicon carbide IR sources are used and when they are used with the types of parabolic reflectors needed for runway applications. By using silicon nitride, infrared intensity is substantially increased in both the level of infrared and the range of the wavelength. Moreover, the infrared can be produced in a tighter or more compact infrared focal point wherein it has been found to work extremely well with parabolic reflectors to broadcast the infrared a much greater distance with lower power consumption. Moreover, silicon nitride sources produce an infrared source that remains constant over time with minimal drift.

According to yet further aspects of the present invention, the IR source is configured to work within a PAR style lamp wherein the approach light of this application can be merely screwed into existing runway lighting systems. Accordingly, the invention of this application could be used on any available AC voltage socket. This can include, but is not limited to, replacing a certain number of LED lights with the PAR style lights of this application.

According to even yet further aspects of the present invention, the PAR style lights can be modified to further enhance the IR output of the IR source without having to modify the existing runway lighting systems.

It has been found that the invention of this application can utilize existing runway lighting systems and existing AC voltage socket, but which produces wide band infrared radiation with less energy.

According to other aspects of the present invention, the approach light can include both a high efficiency IR source and high efficiency visible light source wherein the approach light can product both IR output and visible light output more efficiently. Moreover, the dual source light can be configured as a PAR style light and can be used to replace even all of the runway lights in a runway lighting system.

According to even yet other aspects of the present invention, the IR source can include a quartz window, which can be the cover over the PAR style light to even further improve the IR output of the light.

According to other aspects of the present invention, the IR source can include one or more filters.

According to certain aspects of the present invention, the filter includes a quartz window.

According to other aspects of the present invention, the filter can include a "high pass" filter that blocks radiation below a certain level. In one set of embodiments, the filter is below about 1.5 microns. In another set of embodiments, it is below about 2 microns.

According to even other aspects of the present invention, the IR source can include a "low pass" filter that blocks radiation above a certain level.

According to yet even other aspects of the present invention, the IR source can include a combined filter wherein it can include more than one filter. For example, the filter can include both a "high pass" filter and a "low pass" filter that can, when used in conjunction with an IR source(s), generate a particular range(s) of wavelengths. This can include an IR bandpass filter that allows only the desired range of wavelengths to pass. Essentially, this can act as both a low pass and a high pass filter wherein the filter rejects (attenuates) frequencies outside the desired range.

According to yet further embodiments, the approach light can include one or more selective controls configured to all the IR source and the visible light source to operate independently from one another. As a result, the IR source can operate independently and/or in conjunction with the visual light source depending upon the weather conditions. Moreover, the selective control of the IR source can be used for other purposes, such as to melt ice and snow from the lens of the light when only the visible light source is required, but where snow and ice are impeding the efficiency of the visibility of the light.

These and other objects, aspects, features and advantages of the invention will become apparent to those skilled in the art upon a reading of the Detailed Description of the invention set forth below taken together with the drawings which will be described in the next section.

BRIEF DESCRIPTION OF THE DRAWINGS

The invention may take physical form in certain parts and arrangement of parts, a preferred embodiment of which will be described in detail and illustrated in the accompanying drawings which form a part hereof and wherein.

DESCRIPTION OF PREFERRED EMBODIMENTS

Figure 1:
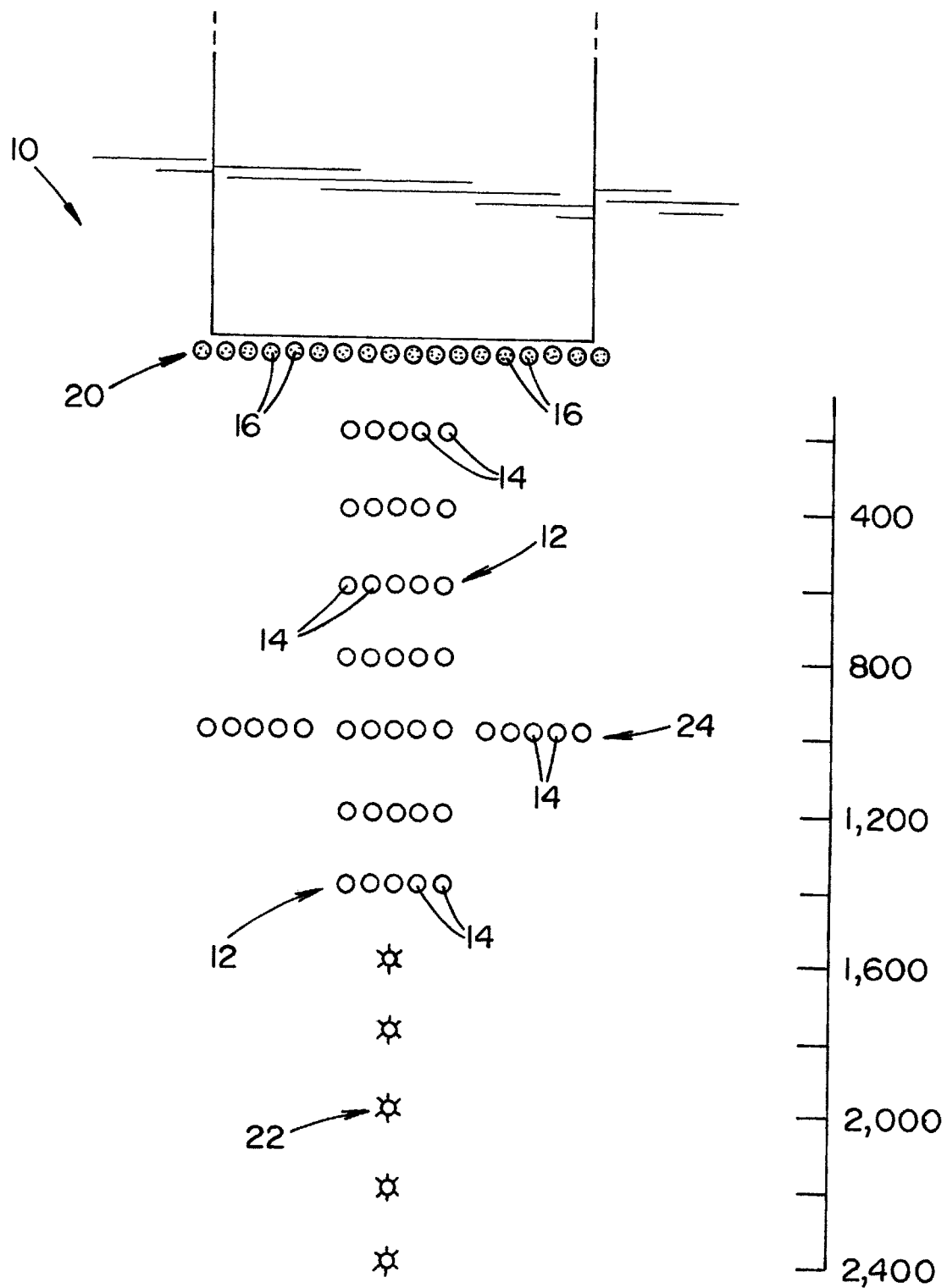
FIG. 1 is a schematic view of a MALSR, or Medium Intensity Approach Lighting System.

Referring now to the drawings wherein the showings are for the purpose of illustrating preferred and alternative embodiments of the invention only and not for the purpose of limiting the same, the invention of this application relates to a light 100 that can be used as an airport runway light. More particularly, the invention relates to runway light 100 that includes a high efficiency infrared (IR) source 110 that can be used for runways and the like.

However, while it has been found that the light of this application works particularly well for use on a runway and will therefore be discussed in relation thereto, the invention of this application has broader application wherein its broad and accurately controllable infrared output can be used in a wide range of applications wherein the invention should not be limited to runway applications.

In greater detail, and with reference to a preferred use of the invention of this application, the present invention is used as an approach light used in an airport runway lighting system 10. Runway light 100 includes IR source 110 that is a high output and energy saving semiconductor IR light source that can be used for runway approach light systems 10.

The "Why" of the IR Source

Parabolic reflector type optical lamps ("PAR") come in various sizes, output beam shapes and have many uses. Parabolic reflector type optical lamps are named according to their outer diameter measured in ⅛ of an inch, e.g., a PAR20 lamp has an output lens diameter of 20×⅛ inches or 2.5 in; a PAR38 lamp has an outer diameter is 38×⅛ in=4.25 in; a PAR56 lamp has an outer diameter is 56×⅛ in=7.0 in.

PAR38 and PAR56 lamps are widely used as above the ground lamps on airport runways. Of special interest for the invention of this application are those used in the Approach Lighting Systems that extend out ½ mile or more from the beginning of some airport's main runways and help an incoming pilot properly align the plane and control its vertical angle of decent. To aid some planes, such as those of FedEx, United Parcel, and some non-commercial and private jets, to land in foggy weather, the planes are equipped with Enhanced Flight Vision Systems (EFVS), which have cameras sensitive to infrared light which propagates better through fog than visible light. This allows such planes to "see" through fog, come up close enough to visually make out the beginning of the runway, and even reduce from 200 to 100 feet the "decision height" at which the landing has to be aborted At the present time in the US, the Approach Lighting Systems employ incandescent, i.e., heated tungsten filament PAR38s and PAR56s. These emit much more infrared than visible light which makes them highly energy wasteful under most conditions, except for the case of fog, for the relatively few planes equipped with EFVS cameras.

In order to save energy, the US Energy Department has put a stop to the production of many incandescent lamps, requiring instead the use of LED type lamps, which basically only emit visible light. Thus the fact that this makes such lamps effectively invisible in fog to EFVS cameras, (These cameras cost about a million dollars, there are more than a hundred of them currently in use, and the FAA wants to begin using them on passenger planes), this is the last hurdle that is holding up the use of LED lights in Approach Lighting Systems.

The invention of this application produces the needed infrared to solve these problems in the industry. The invention of this application can come in many forms.

A first embodiment is light 100 that includes infrared (IR) source 110 that can be used for runways and the like. In this embodiment, light 100, which includes IR source 110, can be configured to simply screw into Approach Lighting System 10 fixtures that could, for example, be mounted side by side with visible LED type PAR lamps. Together, the invention of this application and currently available visible LED type PAR lamps would draw less energy than the incandescent PAR lamp they would replace, emit as least as much visible light and emit substantially more infrared detectible by all types of EFVS cameras.

Referring to FIG. 1, shown is a MALSR, or Medium Intensity Approach Lighting System 10. These systems include nine ten foot long bars 12, on each of which there are five incandescent 100 to 120 watt white light PAR38 lamps 14. Also included are eighteen 300 watt white light PAR56 lamps fitted with green filters 16; these form the threshold 20, or beginning, of the runway beyond which the pilot can land. There are 900 MALSRs on US runways and many other similar and even larger Approach Lighting Systems on runways throughout the world. Thus, there is a very large need for reduced energy LED type PAR lamps, along with infrared lamps that can be conveniently mounted side-by-side on airports throughout the world.

There is another possible use for the PAR infrared type lamps of this application. The infrared output spectrum of their sources extends over the range 1 to 10 microns. For security type uses, it is possible to use various types of filters to limit a lamp's emitted spectrum, for example, to wavelengths longer than 3 microns, or to wavelengths in the range 3 to 3.5 microns.

In greater detail, a typical MALSR system 10 uses eighteen green lamps (PAR56) 16 along runway threshold 20 spaced ten feet apart. In addition, there are nine light bars 12 with five white lights (PAR 38) 14 separated every two hundred feet and five sequenced flashers 22 also separated every two hundred feet over a distance of 2,400 feet from the runway threshold. At the 1,000 feet point 24, there are three light bars (fifteen lamps) for added visual reference for the pilot on final approach. Sequenced flashing lights provide added visual guidance down the runway centerline path. Planned approach visibility is at least 1,800 feet to 0.5 miles, with a decision-to-land-or-abort altitude of 200 feet.

Again, the invention of this application can utilizes a PAR type lamp configuration, such as PAR38 and PAR56, that employs an IR Source 110. IR source 110 includes a silicon nitride element IR Source instead of tungsten incandescent to produce wide band infrared radiation. Moreover, IR source 110 produces virtually no visible light even though it produces high powered and broad spectrum infrared radiation. In this respect, the infrared source 110 can produce less than 7% of the visible light than the light that is produced by a traditional PAR style bulb. Moreover, the virtually no visible light can be below 5% of the visible light that is produced by a traditional PAR style bulb. IR source 110 will glow red and its peak output of visible light can be less than about 2% that of a PAR38 incandescent bulb.

Figure 2:
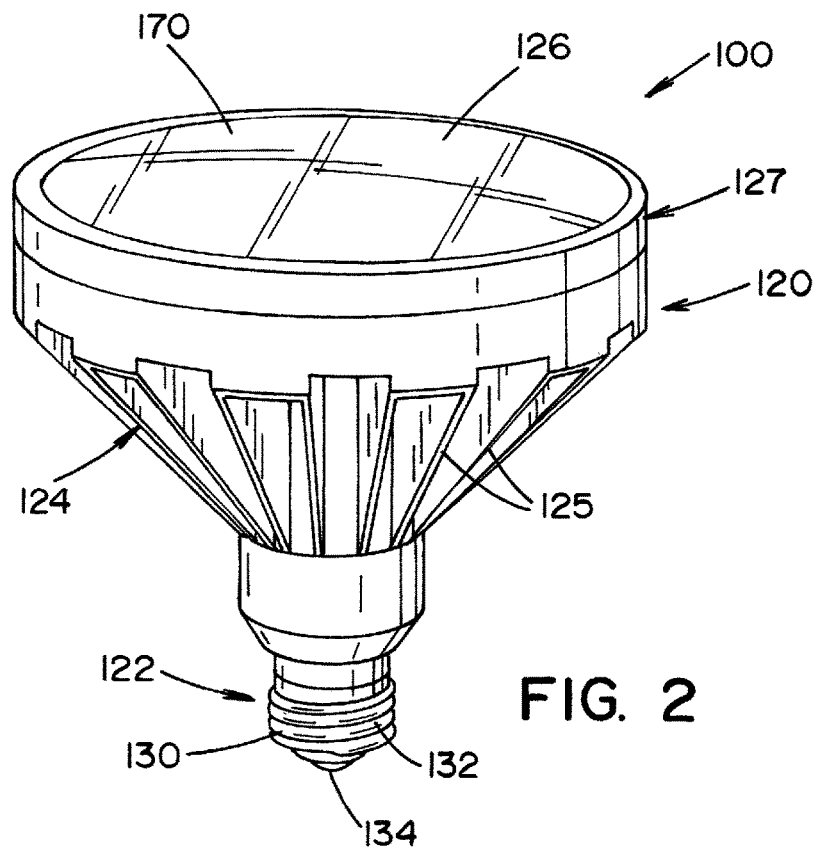
FIG. 2 is a perspective view of a light according to certain aspects of the invention of this application.
Figure 3:
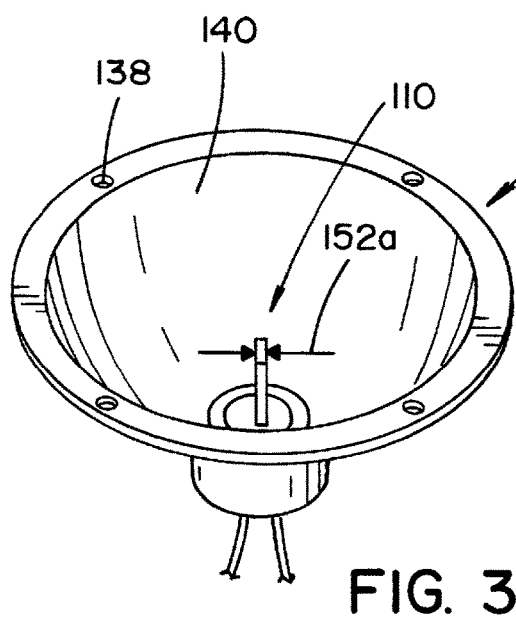
FIG. 3 is a perspective view of a reflector for the lamp shown in FIG. 2.
Figure 4:
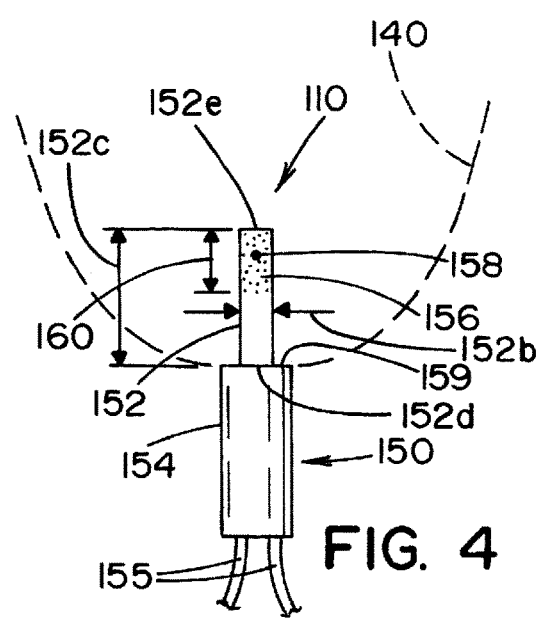
FIG. 4 is an enlarged view of an IR element assembly for the lamp shown in FIG. 2.

In greater detail, and with reference to FIGS. 2-4 showing one set of embodiments, light 100 has a PAR configuration that is designed to replace an existing PAR bulb and/or can be any other type of bulb and/or light fixture. Light 100 includes a light body 120 having a base 122 and an enclosure 124 that can be a wide range of enclosures without detracting from the invention. Enclosure 124 can include cooling fins 125 to prevent the overheating of light 100. Light 100 further includes one or more output windows 126 wherein output window 126 can be part of an output window assembly 127 that can be fixed relative to enclosure 124 by any means known in the art. Base 122 can be a traditional PAR style base having a screw thread 130, an electrical screw thread contact 132 and an electrical foot contact 134. However, other electrical connections and/or bases could be used without detracting from the invention. Again, light 100 can have a wide range of traditional configurations wherein details on the overall bulb structure are not being provided in the interest of brevity in that they are known in the art. Light 100 includes an internal light assembly 136 that includes IR Source 110 that is a high-efficiency IR source that produces significant amounts of infrared radiation and wide band infrared without increased power consumption. Internal light assembly 136 can include one or more securing arrangements 138 to secure assembly 136 relative to enclosure 124 and/or output window assembly 127. Securing arrangements 138 can include fasteners (not shown in this set of embodiments) to fix assembly 136 relative to enclosure 124, or any other fastening arrangement known in the art. Light 100 further includes one or more infrared reflectors 140 wherein infrared reflector 140 can be a wide range of reflectors including a parabolic reflector similar to those configured to work with PAR type lamps (such as PAR38 and PAR56). Reflector(s) 140 can be a part of assembly 136 and/or form the structure itself. In one set of embodiments, IR source 110 employs an element 150 assembly that includes a silicon nitride element 152 instead of tungsten incandescent to produce wide band infrared radiation. Element assembly 150 of IR source 110 can have an IR element 152 that is mounted in a ceramic base 154. Source 110 is electrically connected by way of one or more wires 155.

In one set of embodiments, IR element 152 is a flat element formed from Silicon Nitride with a rectangular cross-sectional configuration having both an element thickness 152*a* and an element width 152*b*. However, other cross-sectional configurations could be used without detracting from the invention of this application. For example, IR element 152 could be cylindrical wherein it has a round cross-sectional configuration with a length and a dimeter. As is shown, length 152*c* of IR element 152 can be significantly longer than width 152*b* and/or the diameter of the element. Below are some dimensions on element 152, which, in the example shown, is flat with width 152*b* and thickness 152*a*. Ceramic base 154 can be a custom bushing design formed from Alumina, Cordierite, and/or Steatite and/or the like. As is shown, IR element 152 extends from ceramic base 154 wherein element 152 extends from an element base 152*d* to an element distal extent 152*e*. Element 152 has an element volume defined by element thickness 152*a*, element width 152*b* and element length 152*c*. As is also shown, base 154 is cylindrical in configuration, but this is not required. The resistance of element 152 can depend on the desired results.

In one set of embodiments, the resistance of element 152 is around 35 Ohms when at zero current/room temperature and the resistance of element 152 can rise to around 50 Ohms at full current. However, these range can vary without detracting from the invention wherein the resistance of element 152 can be in the range of 30-40 Ohms when at zero current/room temperature and the resistance of element 152 can rise to around 45-55 Ohms at full current. In addition, element 152 can have a minimum temperature of about 1,800 degrees Fahrenheit and a maximum temperature of about 3,000 degrees Fahrenheit. The steady state current can be in the range of 0.7 Amps to 2.2 Amps at 120 Volts.

In one set of embodiments, the dimensions of the element assembly 150 are as follows:
  Protruding silicon nitride element 152
    Length 152*c*: 0.820 in +/−0.20 in
    Width 152*b*: 0.020 in +/−0.020 in
    Thickness 152*a*: 0.075 in +/−0.020 in
  Ceramic bushing 154
    Length: 1.350 in +/−0.50 in
    Diameter: 0.397 in +/−0.20 in In another set of embodiments, the dimensions and parameters of the element assembly 150 are as follows:
  Silicon nitride element (overall) 152
    Length 152*c*: 1.2-1.8 in
    Width 152*b*: 0.14-0.20 in
    Thickness 152*a*: 0.03-0.05 in In this set of embodiments, the resistance of element 152 can be in the range of 18-125 Ohms. The operating voltage can be in the range of 102 volts to 132 volts. The current draw can be in the range of 0.4 amps to 1.4 amps at 120 volts. Operating temperature can be in the range of 950 degrees C. to 1,350 degrees C. wherein the max operating temperature is 1,500 degrees C. at 132 volts. Also, wherein time to temperature at 102 volts is about 8 seconds at 980 degrees C.

However, as can be appreciated, the dimensions of assembly 150, IR element 152 and/or bushing 154 can be a wide range of dimensions as well as shapes without detracting from the invention of this application. Moreover, the dimension and/or shape can be adjusted to adjust the overall IR output of the light system and to work with parabolic reflector 140 use in light 100. However, the dimensions noted above relate to the embodiments that utilize Silicon Nitride with a specific parabolic lens or reflector wherein the focal point of other type of reflectors could require a differently dimensioned element. Therefore, the dimensions illustrated above are not to be limiting, but are to describe the embodiments shown.

With reference to the embodiments shown, IR source 110 has a hot spot 156 from which the infrared energy is primarily produced from element 152. Reflector 140 is a parabolic reflector that includes a focal point 158. In the embodiment show, hot spot 156 is at least closely aligned with focal point 158. In that element 152 is formed from a silicon nitride IR Source, hot spot 156 has both high intensity and significant beam concentration wherein the high intensity is at least closely aligned with focal point 158 wherein much of the infrared output is utilized and broadcasted from light 100. This drastically reduces losses in efficiency, increases output and improves beam shape, which are all highly beneficial for runway applications. Moreover, the electrical properties, and therefore their optical ones also, remain constant over time so that the light can be operated for long periods of time with both high output and high efficiencies. In addition, there is substantially no drift. The embodiment shown has a parabolic reflector with a focal point that is centered in the range of about 0.15 inches to 0.5 inches from its back end 159. The hot spot has a hot spot length 160 and is positioned to take advantage of this focal point and can be generally centered relative to the focal point. The hot spot length can be in the range of about 0.70 inches to 0.30 inches in length along the silicon nitride strip that forms element 152. With this configuration, the IR output beam is emitted as a maximized well shaped gaussian pattern of full width at half maximum of 10 degrees or other desired full width.

According to one set of embodiments, output window 126 can be formed by quartz glass window secured in assembly 127. By including a quartz window for output window 126, there is little or no absorption of IR radiation under 4 microns and there is substantial radiation in the 2 to 4 micron range of infrared. Traditional glass envelopes of incandescent PAR lamps completely absorb infrared radiation of wavelengths longer than about 2 microns. This is important in that the IR cameras used are much more sensitive at 4 microns than at 2 microns and the invention of this application produces infrared at this more detectable range to utilize this greater sensitivity, which before now was not possible.

Yet even further, light 100 can include one or more filters 170. In one set of embodiments, quartz window 126 acts as filter 170. According to other embodiments, filter 170 can include a "high pass" filter and/or a "low pass" filter. A high pass filter blocks radiation below a certain level. A low pass filter that blocks radiation above a certain level. In one set of embodiments, the high pass filter blocks radiation below about 1.5 .microns. In another set of embodiments, the high pass filter blocks radiation below about 2 microns. In yet other sets of embodiments, the high pass filter blocks radiation below a level that is in the range of 1 to 3 microns. As for the "low pass" filter, which blocks radiation above a certain level, the low pass filter can be configured to block radiation above about 4 microns. In yet other sets of embodiments, the low pass filter blocks radiation above a level that is in the range of 3 to 5 microns. Moreover, filter 170 can include a combined filter wherein it can include more than one filter. For example, filter 170 can include both a high pass filter and a low pass filter that can produce IR sources of particular ranges of wavelengths.

This can be used to produce a focused and targeted range of high powered infrared radiation that is much more detectable than prior art IR sources and with less energy consumption.

It has been found that the light of this application produces significant increases in usable infrared output power as compared to a standard incandescent PAR 38 style lamp. Therefore, the invention of this application can greatly exceed the infrared output of a standard PAR style lamp with much less power.

Again, the invention of this application can include one or more filters 170. This, combined with the infrared source 110 provides both a much broader range of infrared output and a much more controllable output. Moreover, the one or more filters 170 can be used to fine tune the broad and powerful infrared product by source 110 to create a highly controlled and desirable IR range. Again, this is important in that the IR cameras can be much more sensitive in a particular range of infrared wherein infrared outside this range is merely a waist. For example, infrared cameras used in planes are much more sensitive at 4 microns than at 2 microns and the invention of this application can provide a wide range of output spectrum to utilize this greater sensitivity. In this respect, infrared source 110 of this application produces an infrared output spectrum that extends over the range of about 1 to 10 microns. Based on the type of use, various types of filters to limit the lamp's emitted spectrum also can be utilized. This can include the high pass filters noted above that block radiation below a certain level. In one set of embodiments, the high pas filter filters IR below about 1.5 .microns. In another set of embodiments, IR is filtered below about 2 microns. The invention can also include a "low pass" filter that blocks radiation above a certain level and/or combinations thereof.

In one set of embodiments, infrared source 110 produces a broad range of IR and output window 126 includes a quartz window that behaves like a low pass filter wherein output window 126 will transmit radiation from the visible out to about 4 microns wherein the transmission of the light drops to about zero about what is defined as a max filter point (infrared is filtered out above the max filter point). In one set of embodiments, the max filter point is about 4 microns as is noted above. However, and as can be appreciated, the max filter point may not be an exact number and/or an exact integer. Therefore, having a max filter point of about 4 microns can be a max filter point in the range of 3.5 microns to 4.5 microns. In another set of embodiments, the max filter point is in the range of 3.7 to 4.3 microns. In another set of embodiments, the max filter point is in the range of 3.9 to 4.1 microns. In yet another set of embodiments, the max filter point can be in the range of 4 to 5 microns. For the one or more high pass filters, they can be defined by a min filter point wherein infrared is filtered out or removed below the min filter point. In one set of embodiments, the min filter point is about 3 microns. However, and as can be appreciated, the min filter point also may not be an exact number and/or an exact integer. Therefore, having a min filter point of about 3 microns can be a min filter point in the range of 2.5 microns to 3.5 microns. In another set of embodiments, the min filter point is in the range of 2.7 to 3.3 microns. In yet another set of embodiments, the min filter point is in the range of 2.9 to 3.1 microns. In yet another set of embodiments, the min filter point is in the range of 2 to 4 microns. By including both a high pass filter and a low pass filter, light 100 can produce IR radiation in the range of about 3 to 4 micron, which is a min filter point of about 3 microns and a max filter point of about 4 microns wherein there is a 1 micron band pass result. Similar results, in terms of band pass type systems, in principal can be obtained by combining a low pass filter having a max filter point of about 8 microns, followed by a high pass filter having a min filter point of about 7 microns, which again resulting in about a 1 micron band pass result, but a different 1 micron band pass result. This could be used for different applications, such as for covert type applications.

Yet even further, filter(s) 170 can include a single filter that transmits a range of wavelengths. This can include an IR bandpass filter that allows only the desired range of wavelengths to pass. Essentially, this can act as both a low pass and a high pass filter wherein the filter rejects (attenuates) frequencies outside the desired range.

Figure 5:
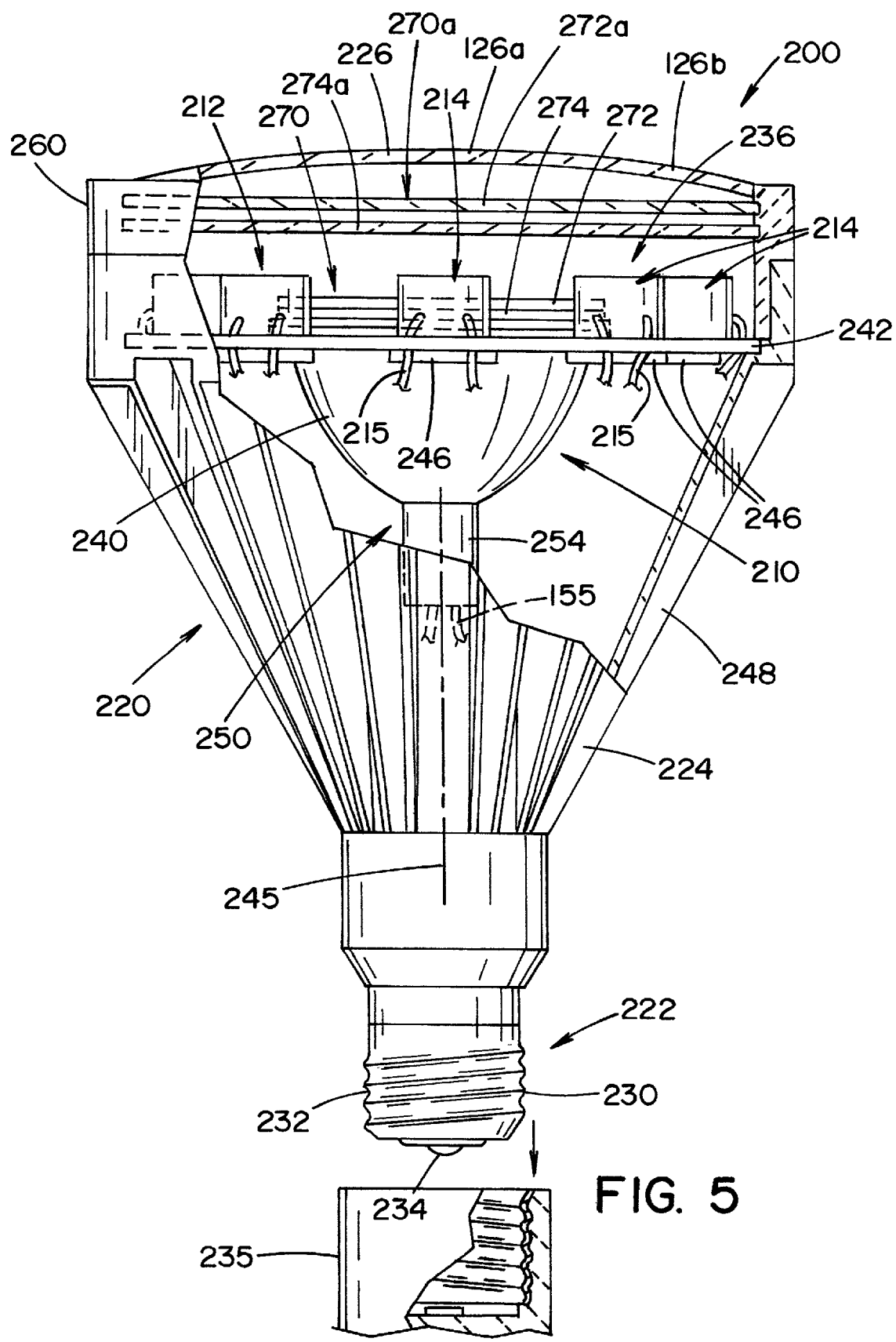
FIG. 5 is a partial sectional view of another set of embodiments that also includes a visible light source.
Figure 6:
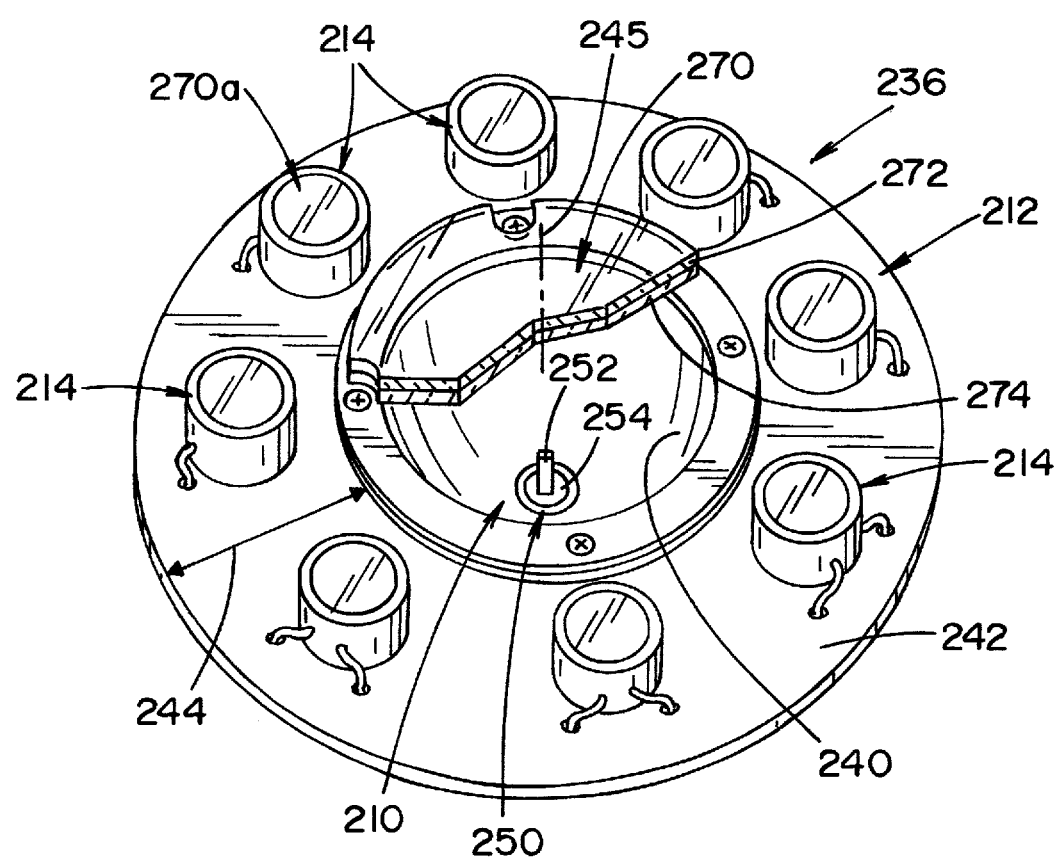
FIG. 6 is a perspective view of an internal light assembly of the light shown in FIG. 5; and, FIG. 7 is a schematic view of an electrical system for lights according to certain aspects of the invention.

With reference to FIGS. 5 and 6, shown is yet another set of embodiments. In greater detail, shown is a light 200, which can also have a PAR like configuration, which includes both an IR source 210 and a visible light source 212. Again, IR sources 110, 210 of this application produce virtually no visible light, but produce high powered and broad spectrum infrared radiation. In this respect, the infrared sources 110, 210 produce less than 7% of the visible light than is produced by a traditional PAR style bulb. Moreover, the virtually no visible light can be below 5% of the visible light that is produced by a traditional PAR style bulb. These IR sources (110, 210) glow red and its peak output of visible light can be less than about 2% that of a PAR38 incandescent bulb. IR sources 210 can be configured that same as IR source 110 discussed above wherein the description above with respect to IR source 110 can also apply to source 210 wherein the description will not be repeated in the interest of brevity.

Accordingly, the invention can further include a visible light source. In the embodiment shown in FIGS. 5 and 6, light source 212 includes eight independent light fixtures or assemblies 214; however, more or less than eight light assemblies could be used without detracting from the invention of this application. Light assemblies 214 include electrical connection wires 215. As with other embodiments of this application, light 200 can be designed to replace existing PAR bulbs and/or any other type of bulb. Moreover, it could be incorporated into its own light fixture (not shown). However, since light 200 also produces visible light, it could be used to replace all lights in runway lighting system 10.

Light 200 includes a light body 220 having a base 222, an enclosure 224 and one or more output windows 226. Base 222 can be a traditional PAR style base having a screw thread 230, an electrical screw thread contact 232 and an electrical foot contact 234 to work in a standard PAR 38/56 style light socket 235. Again, light 200 can have a wide range of traditional configurations wherein details on the overall bulb structure are not being provided in the interest of brevity in that they are known in the art. In the embodiments shown, Light 200 includes an internal light assembly 236 that can support both IR source(s) 210 and visible light source(s) 212. Light 200 includes IR Source 210 that is a high-efficiency IR source that produces significant amounts of infrared radiation and wide band infrared without increased power consumption. Light 200 further includes one or more infrared reflectors 240 wherein infrared reflector 240 can be a wide range of reflectors including those having the same general configuration as those used on PAR type lamps (such as PAR38 and PAR56) and/or to produce a desired beam concentration. However, infrared reflector 240 can also be configured for the specific use in connection for the broadcasting of infrared, which is not possible with traditional PAR bulbs. In one set of embodiments, IR source 210 employs element assembly 250 that can be the same, or similar to element assembly 150 referenced above, which can be a silicon nitride element 252 instead of tungsten incandescent to produce wide band infrared radiation in increased intensities without additional power consumption. As with the embodiment discussed above, element assembly 250 of IR source 210 can have a flat IR element 252 that can be mounted in ceramic base 254, or the like, which is electrically connected by way of wires 155.

In the embodiment shown, light 200 has a plurality of visible light assemblies 214 that are independent of IR source 210. However, any number of visible light sources could be utilized in the invention of this application. In greater detail, light 200 can include any type of visible light source that can work in combination with IR source 210 so that light 200 produces both infrared radiation and visible light.

In the embodiment shown, visible light sources 214 are LED light sources in that they efficiently produce visible light. Light 200 can include a wide range of configurations to allow both infrared radiation and visible light to be projected by light 200. In the embodiment shown, light 200 includes a centralized infrared source with the visible light source surrounding the infrared source. In particular, light 200 include a light ring 242, which can be part of internal light assembly 236. Ring 242 surrounds reflector 240 wherein visible light assemblies 214 are fixed relative to ring 242 and circumferentially surround reflector 240. The group of white light LEDs forming assemblies 214 can be configured to match the intensity and beam pattern of the visible light output of a PAR38 incandescent spot lamp and/or that of a PAR56 incandescent spot lamp and/or improve intensity. However, IR source 210 has been found to substantially exceed the infrared intensity and the wavelength range of such incandescent spot lamps.

Light 200, when in a PAR38 format, can include a 3 inch diameter parabolic reflector 240 for the IR beam former. This reflector is surrounded by ring 242, which is an annular light ring. In one embodiment, ring 242 has a width 244 that is at least 0.7 inches. In another embodiment, width 244 is at least 0.875 inches. In another set of embodiments, width 244 is less than 2.5 inches. In yet another embodiment, width 244 is less than 2.0 inches. Ring 242 preferably includes a plurality of visible light assemblies 214 circumferentially spaced about the ring and about a light axis 245. In one set of embodiments, light assemblies are equally spaced about ring 242. In another set of embodiments, there are at least three visible light assemblies 214. In yet another set of embodiments, there are at least six light assemblies 214. In even yet another set of embodiments, there are eight to ten visible light assemblies 214. Light sources and/or light assemblies can be any visible light producing system. As noted above, it has been found that LED lights sources work well to produce the visible light in view of their efficiency. Light assemblies 214 can be a narrow beam lensed 8 to 10 watt white light LEDs, e.g. CREEEXPL-830-1 warm white LEDs. The visible light assemblies can be mounted on annular light ring 242 along with their electronic drivers and finned heat sinks. Ring 242 can be manufactured from a wide range of materials including, but not limited to, aluminum. In one embodiment, ring 242 is annular and has a 3 inch inside diameter and a 7 inch outside diameter wherein the ring is 0.375 inches thick. Moreover, ring 242 can be machined to minimize heat transfer from the reflector to the ring. The LED drivers of assemblies 214 can be mounted on the back side of ring 242 to power the LEDs mounted on the front side of the ring wherein they can operate at about 8 watts each. The electrical input to the drivers will range up to 120 volts AC. In addition to the drivers, finned heat sink(s) 246 can be mounted on the back side of ring 242. In addition, enclosure 224 can include one or more heat sinks 248.

According to one set of embodiments, output window 126 can be formed by quartz glass window. Yet even further, output window 126 can have one or more sections depending on performance goals include whether the sections are in line with IR source 210 or Visible light source 212. These sections can be separate components and/or can be different portions of the same component. In this respect, output window 126 can be a part of an output window assembly 260 that can be fixed relative to enclosure 224 by any means known in the art. Window 126 can include a window section 126a that covers only IR source 210. Window section 126a can be a quartz glass having a diameter of about 3.5 inches and a thickness of about ⅛ inches. Window section 126a can be configured to cover the output end of the 3 inch diameter parabolic reflector 240 of IR source 210. This window section will transmit with very little attenuation IR in the range 1.0 to 3.8 microns in the beam from the IR source. The window can be held in place by any means known in the art including, but not limited to a narrow ring surrounding the outer ⅛ inch edge of the window and attached to the front of ring 242 (not shown).

A separate covering and/or section could be used for visible light assemblies 214 including individual covers for each of the lights 214. Again, by using a quartz window for output window 126, there is little or no absorption of IR radiation out to 4 microns and there is substantial radiation in the 2 to 4 micron range of light. Traditional glass envelopes of incandescent PAR lamps completely absorb infrared radiation of wavelengths longer than about 2 microns. This is important in that the IR cameras used are much more sensitive at 4 microns than at 2 microns and the invention of this application produces infrared at this more detectable range to utilize this greater sensitivity, which before now was not possible. But, this is not needed for the visible lights wherein an annular window section 126b can be used to cover the LEDs and which can be basic glass. Moreover, the light can include a cone shaped, heat transfer finned, electrically electroded cover that will form the base of this light (not shown).

As with light 100, light 200 can include one or more filters 270 and/or 270a. Moreover, light 200 can include one or more filters for IR source 210 and/or visible light source 212 wherein filters 270 can be used for IR source 210 and filters 270a can be used for visible light source 212. Filter(s) 270 can be configured to cover only the IR source, which is the preferred embodiment. However, filters 270 could be configured to cover the entire light opening. Similarly, filters 270a can cover only visible light source 212 and/or cover the entire window. In the preferred embodiments, filters 270a only cover the visible light source. Yet further, filters 270 and/or 270a can include and/or be part of the quartz window and/or part of the output window. With respect to filters 270, these filters can include a "high pass" filter 272 that blocks radiation below a certain level and/or a "low pass" filter 274 that blocks radiation above a certain level, which was discussed in greater detail above.

Moreover, filter(s) 270 can include a combined filter wherein it can include more than one filter wherein, as is shown, filter 270 can include both a "high pass" filter 272 and a "low pass" filter 274 that can produce IR sources of particular ranges of wavelengths, which is discussed in greater detail above. Also, one or more of the filters can be part of window 126. Again, that can include one or more IR bandpass filters that allow only the desired range of wavelengths to pass, which is discussed in greater detail above.

Filters 270a can also include filters (shown in the drawings as filters 272a and 274a) that control the passage of light, but these filters can be configured to control visible light. For example, filters 270a could include a color pass filter 272a wherein filters can be used to change the color and/or intensity of the visible light and/or any other type of light filter known in the art. As can be appreciated, while filters 272a and/or 274a are shown near window 126, the filters can also be a part of internal light assembly 236 as is shown in FIG. 6, individual light assemblies 214 and/or the LED light itself without detracting from the invention.

It has been found that the lights of this application produce significant increases in optical output power as compared to a standard incandescent PAR 38 style lamp. Therefore, the invention of this application can greatly exceed the IR output of a standard PAR style lamps with much less power consumption. Moreover, light 200 can also produce more visible light in addition to the increased in infrared output power without increases in power consumption.

According to yet even further embodiments, IR Sources 110, 210 can be selectively operable infrared sources. As can be appreciated, and as is discussed in greater detail above, infrared is needed primarily when the weather conditions are unfavorable or the visibility is bad. When these conditions occur, a pilot uses an infrared (IR) camera or an enhanced flight vision system (EFVS) equipped in the cockpit to detect infrared rays emitted from the thermal source for safe landing. In greater detail, IR Sources 110, 210 can be operable separate from visible light sources. With respect to infrared produced from IR Sources 110, the entire light 100 can be operable separate from other visible light sources used on the runway. As is discussed in greater detail above, lights 100 can be used in combination with visible light sources that can be separate fixtures wherein power can be supplied to IR sources 110 only when the conditions call for the use of infrared. Therefore, light 100 can include one or more systems and/or electronics for selective use wherein some of these will be discussed below in reference to light 200.

In this respect, light 200 includes both IR source 210 and visible light source 212 wherein selective controls can be configured such that IR source 210 and visible light source 212 can be operated independent from one another. In greater detail, light 200 can include a wide range of internal electronics to allow independent operation between IR source 210 and visible light source 212 and the systems to allow for the control of the independent, or partially independent, internal systems and control.

Figure 7:
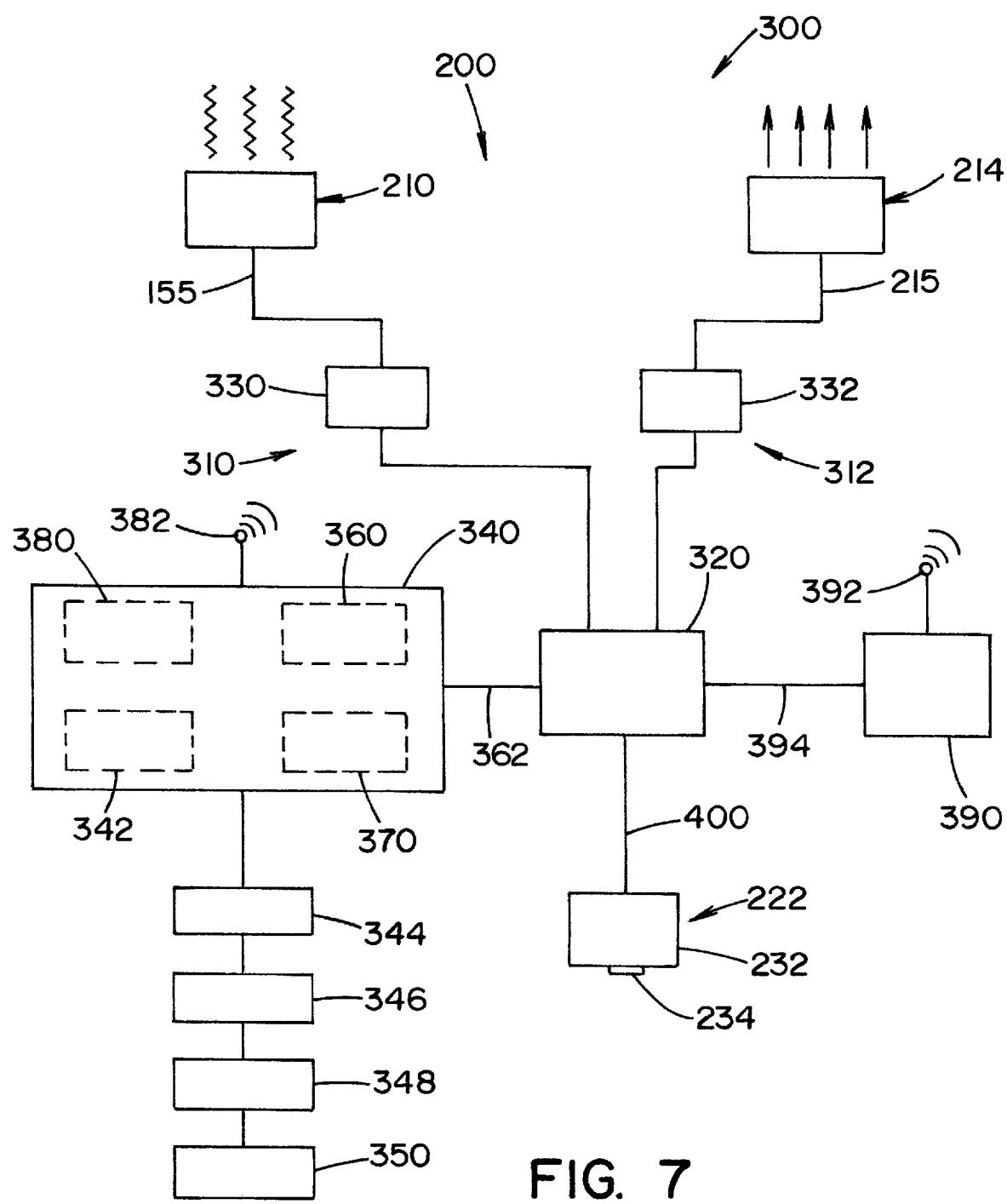

With reference to FIG. 7, one such system is shown schematically for light 200 as system 300. System 300 is for light 200, but some of these systems can be used for light 100. In greater detail, light 200 includes both one or more IR source 210 and visible light source 212 wherein visible light sources includes one or more light assemblies 214. In the embodiment shown, source 210 includes silicon nitride element 252 to produce the wide band infrared radiation and ceramic base 254 to hold the element in place within the light. IR source 210 is electrically connected by way of one or more wires 155 or the equivalent. Light assemblies 214 are operably connected to electrical system 300 by way of connection wires 215 or the equivalent.

System 300 includes a first electric circuit 310 and a second electrical circuit 312, which can be any electric circuit known in the art, including, but not limited to, basic wired systems, wire harnesses and/or solid state systems. First circuit 310 electrically connects IR source 210 to system 300 and can include wires 155. Second circuit 312 electrically connects light assemblies 214 to system 300 and can include wire 215. System 300 further includes one or more switches 320 that operably connect circuits 310 and 312 to a power source 232 wherein switch 320 can selectively direct power between IR source 210 and visible light assemblies 214 based on environmental conditions or for any other reason. Circuit 310 and/or circuit 312 can include transformer(s) and/or electronic systems 330 and 332 that can control any variations in the delivered power including differences in voltage. However, as can be appreciated, these variations could also be manage directly within the light assemblies without detracting from the invention of this application.

System 300 can further include an internal operating system 340 that can include one or more sensors 342. These sensors can include a wide range of sensor to detect environmental conditions. These sensors can include both internal sensors and external sensors including, but not limited to, light sensors 344 to detect the ambient light at the runway, pressure sensor 346 to detect changes in weather, temperature sensors 348 to detect the ambient temperature at the runway and/or an optics sensor 350 for window 226 to detect if the window has any form of obstruction, such as ice or snow.

System 300 and/or internal operating system 340 can further include one or more computing devices 360 that can control system 300 and/or light 200 including, but not limited to, managing power consumption to maximize efficiency and/or the use of IR source 210 and visible light source 212. Any type of computing device could be used without detracting from the invention of this application including both internal and external computing systems. An output signal 362 can be sent to switch 320 to control the power flow between IR source 210 and visible light source 212. However, in at least one embodiment, switch 320 can be part of operating system 340. Operating system 300 and/or internal operating system 340 can further include an internal power supply 370 that can maintain the operation of system 300 even when light 200 is off and/or manage the power inflow to operating system 340 to allow system 340 to operating at different voltages and the like.

Operating system 340 can further include a communication system 380 that can include one or more antennas and/or transceivers 382 to allow system 300, 340 to communicate with external operating systems and controls including an external computing device 360 (not shown). As can be appreciated, communication system 380 can be used to allow external communications to control the operation of the light. According to another set of embodiments, system 300 can include a standalone communication system 390 that can include one or more antennas and/or transceivers 392 to allow external communication to directly communicate with switch 320 with a switching signal 394 including, but not limited to, external computer networks (not shown).

System 300 can be electrically joined to base 232, which can be the power source of the system and which includes electrical screw thread contact 232 and an electrical foot contact 234 of base 222 to produce an input power flow 400 to system 300. Again, any power source and/or connection can be used to power lights 100, 200.

As a result, the IR source can operate independently and/or in conjunction with the visual light source depending upon the weather conditions. Moreover, the selective control of the IR source could also be used for other purposes, such as to melt ice and snow from the lens of the light when only the visible light source is required, but where snow and ice are impeding the efficiency of the visibility of the light.

While considerable emphasis has been placed on the preferred embodiments of the invention illustrated and described herein, it will be appreciated that other embodiments, and equivalences thereof, can be made and that many changes can be made in the preferred embodiments without departing from the principles of the invention. Furthermore, the embodiments described above can be combined to form yet other embodiments of the invention of this application. Accordingly, it is to be distinctly understood that the foregoing descriptive matter is to be interpreted merely as illustrative of the invention and not as a limitation.

It is claimed:

1. An airport runway light for use as a runway approach light and runway light for a runway lighting system, the runway light comprising a light body having a base configured to support the runway light in an associated light socket of an associated runway lighting system, the base including an electrical connection to electrically connect the runway light to the associated runway lighting system, the light further including one or more output windows wherein the runway light has a high-efficiency infrared source and one or more infrared reflectors to direct the infrared source outwardly through the one or more output windows, the infrared source having a silicon nitride element, the silicon nitride element having a volume of a silicon nitride material extending from a silicon nitride element base to a silicon nitride element distal extent, the silicon nitride element base and silicon nitride element distal extent defining an element length of the silicon nitride material that is transverse to the one or more output windows, the volume of silicon nitride material having an element thickness and an element width that are transverse to the element length, the element thickness and the element width being less than the element length, the silicon nitride element producing a hot spot of infrared radiation emanating from within the volume of silicon nitride material when electrified, the hot spot having a hot spot length along the element length that is less than the element length and between the element base and the element distal end, wherein the infrared source produces high amounts of infrared radiation emanating from the hot spot within the volume of silicon nitride material and produces virtually no detectable visible light and with much less energy consumption than an incandescent PAR style lamp.

2. The airport runway light of claim 1, further including a visible light source that is separate from the infrared source.

3. The airport runway light of claim 2, wherein the visible light source includes a plurality of light assemblies spaced from the infrared source.

4. The airport runway light of claim 1, wherein the runway light has a central axis and the infrared source is centered on the central axis; the airport runway light further including a plurality of visible light assemblies that are separate from the infrared source, the plurality of visible light assemblies surrounding the infrared source and being coaxial with the central axis.

5. The airport runway light of claim 4, wherein the plurality of visible light assemblies includes a plurality of LED light assemblies.

6. The airport runway light of claim 1, wherein the one or more output windows is at least one of made of quartz and includes at least one filter for the infrared source.

7. The airport runway light of claim 1, wherein the runway light includes at least one filter for the infrared source, the at least one filter includes at least one of a high pass filter and a low pass filter.

8. The airport runway light of claim 1, wherein the silicon nitride element is supported by a ceramic bushing, the hot spot of the silicon nitride element having a minimum temperature of about 1,800 degrees Fahrenheit and a maximum temperature of about 3,000 degrees Fahrenheit.

9. The airport runway light of claim 8, wherein the silicon nitride element has a resistance in the range of 45-55 Ohms at a steady state current condition and the steady state current condition being in the range of 0.7 Amps to 2.2 Amps at 120 Volts.

10. The airport runway light of claim 1, wherein the runway light has a central axis, the one or more infrared reflectors being a single centered infrared reflector that is coaxial with the central axis and wherein the silicon nitride element is also coaxial with the central axis, the runway light further including an annular light ring coaxial with the central axis and extending about the centered infrared reflector, the runway light having a plurality of visible light assemblies that are separate from the infrared source and that are fixed relative to the annular light ring.

11. The airport runway light of claim 1, wherein the one or more infrared reflectors is a parabolic infrared reflector having a focal point, the hot spot of the silicon nitride element being in alignment with the focal point.

12. The airport runway light of claim 11, wherein the volume of the silicon nitride material of the silicon nitride element has a flat shape with a rectangular cross-sectional configuration of silicon nitride material with the element thickness being in the range of about 0.03 inches to about 0.08 inches and the element width being in the range of 0.10 inches to 0.25 inches.

13. The airport runway light of claim 12, wherein the volume of the silicon nitride material of the silicon nitride element has a cylindrical cross-sectional configuration wherein the element thickness is equal to the element width.

14. The airport runway light of claim 12, wherein the focal point of the parabolic infrared reflector is from 0.15 inches to 0.5 inches from a back end of the parabolic infrared reflector.

15. The airport runway light of claim 14, wherein that hot spot has a hot spot length and the hot spot length is in the range of about 0.70 inches and 0.30 inches.

16. The airport runway light of claim 1, further including a visible light source that is separate from the infrared source, the infrared source being selectively operable independently of the visible light source.

17. The airport runway light of claim 16, further including an electrical system wherein the infrared source is electrically connected to a power source by a first circuit and the visible light source is electrically connected to the power source by a second circuit, the electrical system further including a switch between the first and second circuits and the power source to selectively power the first and second circuits together and independently.

18. The airport runway light of claim 17, further including an operating system, the operating system operably controlling the switch based on at least one input.

19. The airport runway light of claim 18, wherein the at least one input includes input from at least one of a light sensors, a pressure sensor, a temperature sensors, an optics sensor and an external signal.

* * * * *